United States Patent
Rao et al.

(10) Patent No.: US 6,316,981 B1
(45) Date of Patent: *Nov. 13, 2001

(54) SIGNAL DISTRIBUTION NETWORK ON BACKSIDE OF SUBSTRATE

(75) Inventors: Valluri R. Rao, Saratoga; Jeffrey K. Greason, Tehachapi; Richard H. Livengood, Los Gatos, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/524,079

(22) Filed: Mar. 13, 2000

(51) Int. Cl.⁷ ....................................................... H03K 1/04
(52) U.S. Cl. .......................... 327/298; 327/295; 327/565; 257/698; 257/778
(58) Field of Search .................................. 327/292, 295, 327/298, 564–566; 395/551, 552, 555–558; 257/698, 773, 774, 776–778

(56) References Cited

U.S. PATENT DOCUMENTS

| | | | |
|---|---|---|---|
| 4,659,968 | * 4/1987 | Nakamura | 438/668 |
| 4,731,781 | * 3/1988 | Nakamura | 438/668 |
| 5,498,755 | * 3/1996 | Bayraktaroglu | 438/667 |
| 5,501,006 | * 3/1996 | Gehman, Jr. et al. | 29/840 |
| 5,537,498 | * 7/1996 | Bausman et al. | 327/293 |
| 5,614,442 | * 3/1997 | Tserng | 438/667 |
| 5,717,229 | * 2/1998 | Zhu | 257/208 |
| 5,760,478 | * 6/1998 | Bozso et al. | 257/777 |
| 6,037,822 | * 3/2000 | Rao et al. | 327/565 |
| 6,157,237 | * 12/2000 | Mitra | 327/295 |

\* cited by examiner

*Primary Examiner*—Kenneth B. Wells
(74) *Attorney, Agent, or Firm*—Blakely, Sokoloff, Taylor & Zafman LLP

(57) ABSTRACT

A method and apparatus for clocking an integrated circuit. The apparatus includes an integrated circuit having a clock driver disposed in a first side of a semiconductor substrate, and a clock distribution network coupled to the clock driver and disposed in a second side of the semiconductor substrate to send a clock signal to clock an area of the integrated circuit.

7 Claims, 12 Drawing Sheets

SIGNAL DISTRIBUTION NETWORK ON BACKSIDE OF SUBSTRATE

BACKGROUND OF THE INVENTION

1. Field of the Invention

The invention relates generally to integrated circuit clocking and, more specifically to clock signal distribution in integrated circuits.

2. Description of Related Art

An issue facing the integrated circuit industry today is the problem of distributing clock signals throughout an integrated circuit die with low clock skew. Clock skew is the difference in arrival times of clock edges to different parts of the chip. Synchronous digital logic requires precise clocks for latching data. Ideal synchronous logic relies on clocks arriving simultaneously to all the circuits. Clock skew reduces the maximum frequency of the circuit as the circuit must be designed for the worst case skew to operate reliably.

The challenge facing integrated circuit designers is to insure that the clock switches at exactly the same time throughout the chip so that each circuit is kept in step to avoid delays that can cause chip failure. In prior art global clock distribution networks, clock skew caused by signal routing is typically controlled by the use of hierarchical H-trees. FIG. 1 is a diagram illustrating such a hierarchical H-tree clock distribution network 101 that is implemented in high-speed integrated circuits to reduce the clock skew effect. As shown in FIG. 1, a clock driver 103 is used to drive H-tree network 101 at center node 105. It is appreciated that clock driver 103 is typically a very large driver in order to provide sufficient drive to Htree network 101, which typically has a large capacitance in complex, high-speed integrated circuits as will be described below. As observed in FIG. 1, the clock paths of the "H" formed between nodes 107, 109, 111, and 113 have equal length between center node 105 and each of the peripheral points of the "H" at nodes 107, 109, 111, and 113, respectively. Therefore, assuming a uniform propagation delay of a clock signal per unit length of the H-tree network 101, there should be no clock skew between the clock signal supplied to nodes 107, 109, 111, and 113 from clock driver 103.

FIG. 1 further illustrates H-tree network 101 taken to another hierarchical level with an "H" coupled to each respective peripheral node of the first level "H". Accordingly, every peripheral node 115 is an equal distance from node 107. Every peripheral node 117 is an equal distance from node 109. Every peripheral node 119 is an equal distance from node 111. Finally, every peripheral node 121 is an equal distance from 113. Thus, the clock paths from all nodes labeled 115, 117, 119, and 121 are an equal distance from clock driver 103 and therefore should have no clock skew between them (assuming a uniform propagation delay) since the clock delay from clock driver 103 should be equal at all peripheral nodes of the H-tree network 101. Thus, each node 115, 117, 119, and 121 can be configured to act as a receiving station for a clock signal and service the clocking requirements of an area of the integrated circuit near the node with negligible clock skew with reference to other similarly configured nodes of the H-tree network.

As described, the H-tree propagation delay of a clock signal per unit length of the network may be controlled by placing every peripheral node an equal distance from clock driver 103. However, the propagation delay of a clock signal because of length or distance of the paths traveled by the signal is only one ingredient that leads to skew. Another equally important ingredient is the consistency of speed of the signal as it traverses the path. One component that affects the speed of this signal is the resistance of the metal. Metal layers, such as Aluminum (Al), have an inherent resistivity that is a property of the metal, but the actual resistance a signal encounters can be affected by the thickness of the metal layer, because resistance is inversely proportional to layer thickness. In general, however, clock metal layer thickness is approximately 1.5 microns ($\mu$m) making the resistance of the metal fairly consistent or predictable in most integrated circuits.

The consistency of the speed of the signal in prior art clock distribution networks also depends generally on the impedance the signal encounters as it travels from the clock driver to the receiving station or clocked circuit. For a modern integrated circuit, there could be five or more metal interconnect layers on a chip, each interconnect layer separated from the other by a dielectric layer. The conventional clock network, such as H-tree network 101 overlays this structure. The clock network is laid out on a dielectric preferably overlying a ground plane metal. The speed of the signals along the path of the network is governed by the capacitance created in the dielectric between the clock network and the ground plane metal. Further, this capacitance is not consistent or uniform across the chip. This is so because the topography of a given chip gives rise to local variations, such as variations in the thickness of interlayer dielectric material relative to the underlying layer of metal and the presence of or absence of underlying metal layers. Interlayer dielectric thickness is important relative to the next level of metal. Further, the capacitive coupling from nearby switching lines adds to or subtracts from the clock signal development. The described variations inherent in a chip illustrate that the capacitance is dynamic, and therefore it is difficult to control the impedance encountered by the clock network, and thus the signal speed. In general, there is an inherent raw skew in the H-tree network due to this variation in signal speed of at least 150–200 pico seconds.

One effort to eliminate the skew caused by delays in signal speed is through the use of variable delay buffers (also referred to as deskew buffers) at the ends of the H-tree. The additional intentional skew introduced by these special buffers is controlled by a carefully distributed reference clock whose skew is made small. In this way, the main clocks at each of the endpoints of the H-tree are synchronized to the low skew reference clock. Although this scheme is very effective in reducing clock skew, the deskew buffers can cause additional jitter on the main clock due to the presence of any power supply noise internal to the chip. Hence, reduced skew is traded for increased jitter.

A second effort to eliminate or reduce timing skew is to use copper (Cu) as the interconnect metal forming the clock distribution. Since the consistency of the signal propagation is a function of the product of the capacitance and resistance, reducing the resistance reduces the sensitivity of the signal propagation to variations in the capacitance. The resistance of copper interconnect can be up to 50% lower than that of conventional Al-0.5% Cu. However, as the clock rate keeps climbing, even the resistance improvements provided by copper metallization may not be sufficient to control skew.

Even with sophisticated clock network configurations like the H-tree network, deskew circuits, and copper metallization, integrated circuits typically have a skew budget built into them that allows the circuits to tolerate a certain amount of skew after which point the processing speed must be reduced. A general rule of thumb for a skew budget is a clock skew of 10% of the clock frequency.

In addition to clock skew and jitter, the clock distribution on the chip consumes valuable routing resources on integrated circuits that could be better used for signals and improved signal routability. As noted above, a preferred clock network routing is on top of a chip above a ground plane metal layer and separated by a dielectric layer. This preferred routing requires two layers of metal.

In addition to integrated circuit die area, the global clock distribution networks utilized today consume an increasing amount of power. If the total capacitance of the clock network is C, the power dissipated is $CV^2f$ where V is the supply voltage and f is the frequency. The global clock distribution network on today's high-speed integrated circuit chips typically accounts for approximately 10% of the chip power.

The clock distribution network on a chip must be compatible with the chip package. The conventional packaging of a chip is illustrated in FIG. 2. FIG. 2 is an illustration of a chip 205 packaged in a wire bond package 211. As shown in FIG. 2, wire bonds 203 for example, gold wire bonds, are used to connect package 211 and chip 205.

Another type of packaging, is the Controlled Collapse Chip Connection (C4) packaged chips (sometimes referred to as flip-chip). FIG. 3 is an illustration of a C4 package 251. C4 is the packaging of choice for high frequency chips as it provides high density, low inductance connections using ball bonds 253 between chip 255 and package 261 by eliminating the high inductance bond wires that are in wire bond packages.

SUMMARY OF THE INVENTION

A method and apparatus for clocking an integrated circuit is described. An apparatus includes an integrated circuit having a clock driver disposed in a first side of a semiconductor substrate, and a clock distribution network coupled to the clock driver and disposed in a second side of the semiconductor substrate to send a clock signal to clock an area of the integrated circuit. Additional features and benefits of the invention will become apparent from the detailed description, figures, and claims set forth below.

DESCRIPTION OF THE INVENTION

A method and apparatus for clocking an integrated circuit in a semiconductor substrate is disclosed. In the following detailed description, numerous specific details are set forth in order to provide a thorough understanding of the invention. It will be apparent, however, to one having ordinary skill in the art that the specific detail need not be employed to practice the invention. In other instances, well known materials or methods have not been described in detail in order to avoid obscuring the invention.

The invention provides a method and apparatus for clocking an integrated circuit by routing the clock network along the backside of the semiconductor substrate and bringing clock signals through the backside of the semiconductor substrate to the diffusion/contact regions of the individual devices that make up the integrated circuit and that are controlled by a master clock. The invention makes use of available area on the backside of a chip and is particularly compatible with flip-chip (C4) technology with the routing of the clock network on the substrate backside being completely compatible and functional with existing heat sink technology. The removal of clock network routing from the frontside of the integrated circuit frees up routing resources. Further, additional levels of metal are not needed to control clock skew, for instance, where an additional ground plane metal overlies the structure with the clock overlying the ground plane metal and separated by an interlayer dielectric.

By routing the clock network on the backside of the chip, clock skew can be minimized and controlled. The semiconductor substrate of the chip is a grounded conductor for which capacitance, and thus signal speed, can be completely controlled. Thus, the clock routing on the backside eliminates the need for deskew circuits and the accompanying jitter. By routing the clock over a dielectric having a low dielectric constant, the capacitance of the clock distribution may be reduced leading to reduced power or a smaller clock driver. Further, since the backside of the chip is a grounded plane, there is less impedance change.

FIGS. 4–12 illustrate one embodiment of a method of routing a clock network on the backside of a semiconductor substrate chip that is compatible with flip chip (C4) technology.

Figure 1:
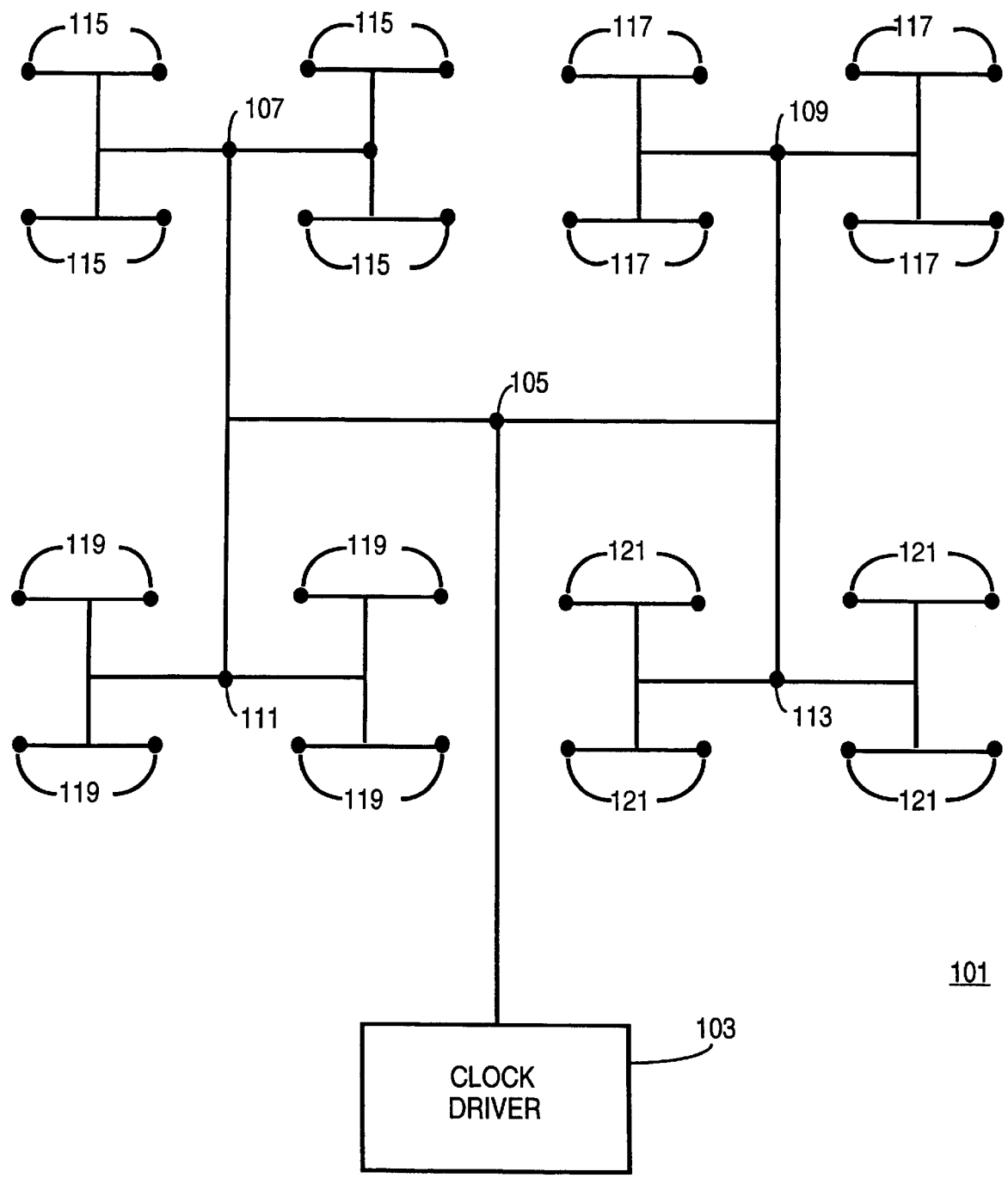
FIG. 1 is a schematic illustration of a prior art hierarchical H-tree clock distribution network that would be used to route clock signals above the chip circuitry.
Figure 2:
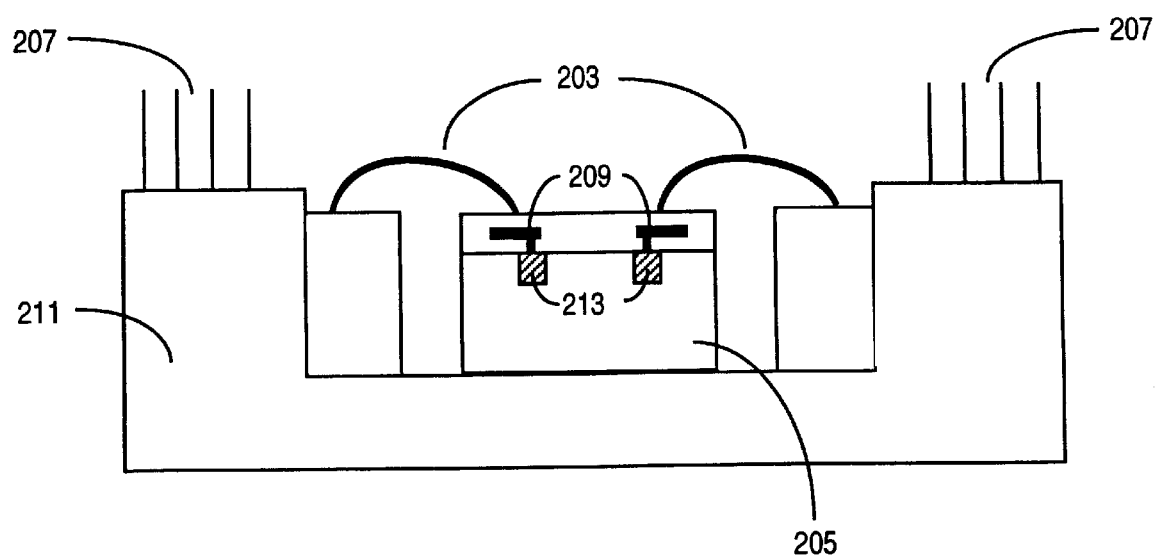
FIG. 2 is a schematic illustration of a prior art wire-bond packaging technology.
Figure 3:
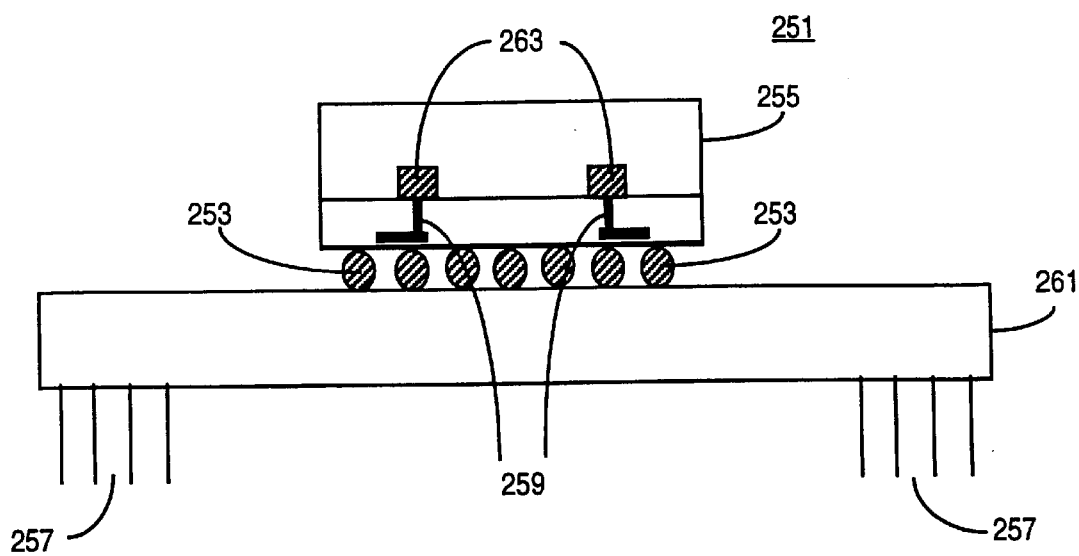
FIG. 3 is a schematic illustration of a prior art flip-chip or C4 packaging technology.
Figure 4:
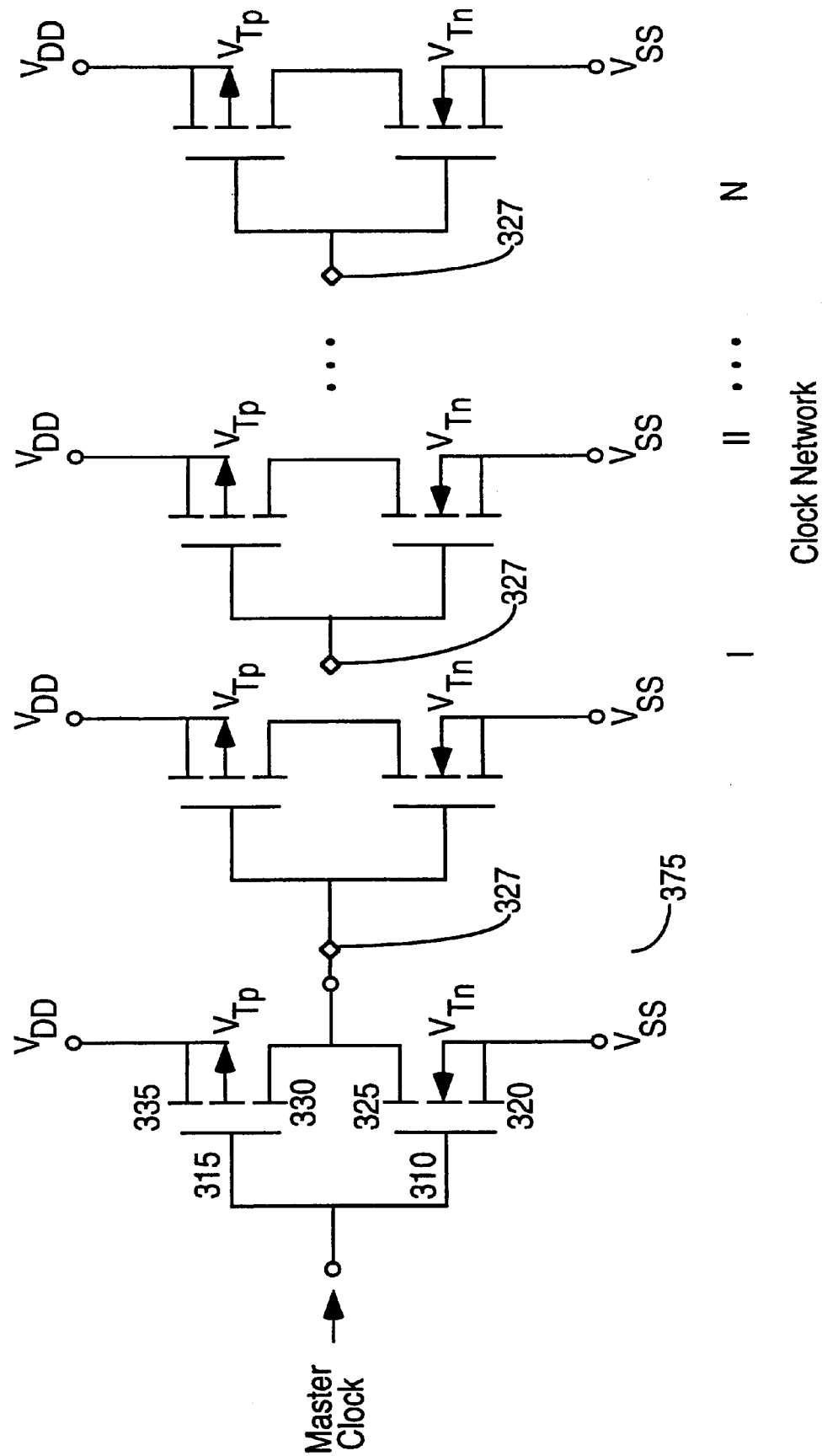
FIG. 4 is a circuit diagram of a clock driver that is used in accordance with the invention to receive a signal from a master clock and transmit a single-ended clock signal to a clock network.

FIG. 4 illustrates by way of a circuit diagram the distribution of a master clock signal through a clock network to multiple receiving stations. In this embodiment, the clock network is, for example, an H-tree that is routed on the backside of a chip. In this embodiment, the sequence of steps involved in fabricating such a structure are: (1) Generate, in the silicon substrate, vias that are filled with metal plugs and which form the medium for electrically connecting circuitry on the chip front side to the clock network on the chip backside; (2) fabricate trenches in the backside on the silicon substrate in the outline of the Htree clock network; and (3) fill the trenches with metal that forms the clock network. These various steps will be described in detail below.

FIG. 4 includes a clock driver 375 that is an inverter circuit, such as a complimentary metal oxide semiconductor ("CMOS") field effect transistor. Clock driver 375 includes an NMOS device (with gate 310, source region 320, and drain region 325) and a PMOS device (with gate 315, source region 335, and drain region 330). NMOS gate 310 is connected to PMOS gate 315 and the two are connected to a master clock.

FIG. 4 shows a clock network in which a master clock drives clock driver 375. Adjacent clock driver 375 are receiving inverters (labeled I, II, N) connected to clock driver 375 (illustrated by node 327) to receive the clock signal.

Figure 5:
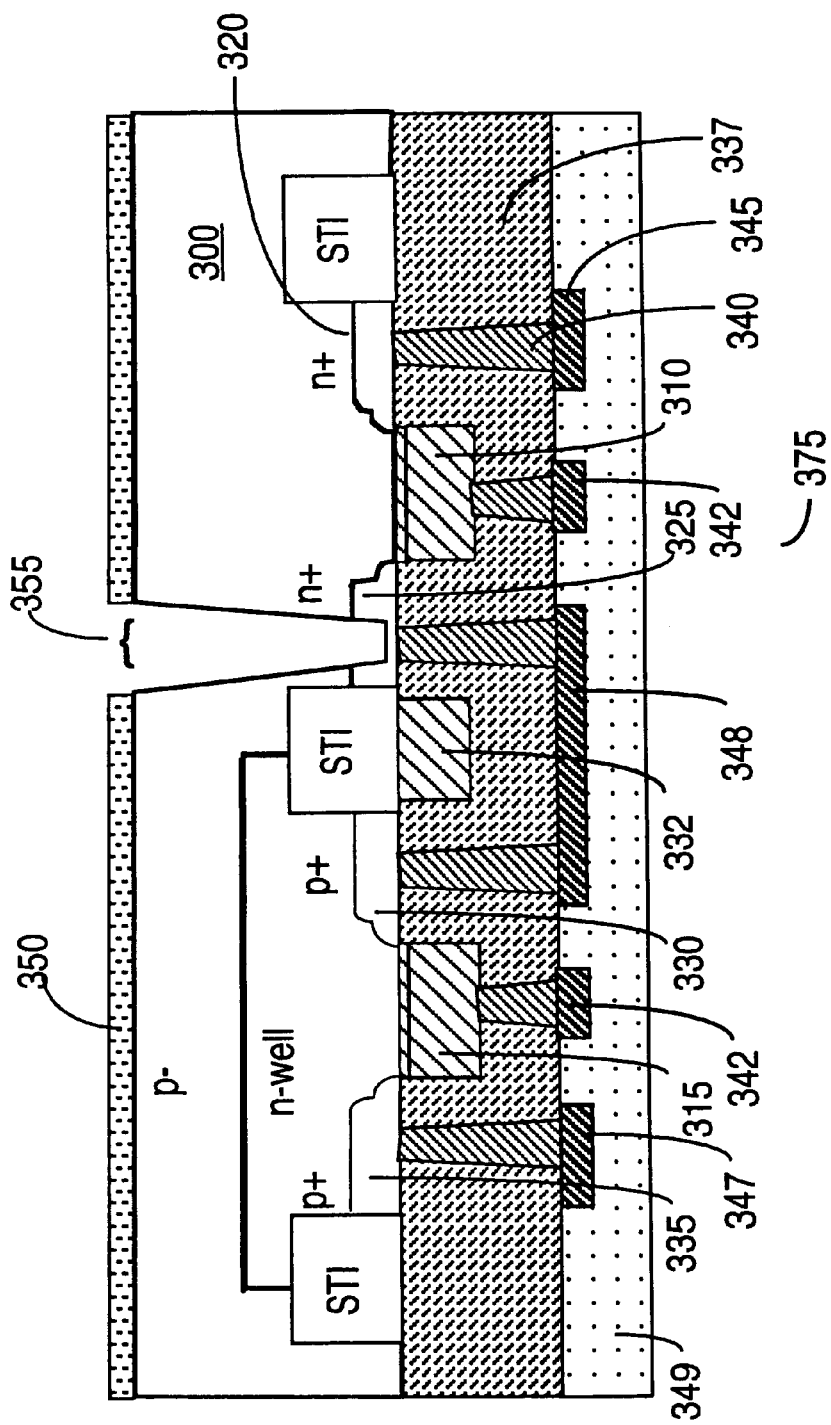
FIG. 5 is a schematic illustration of a cross-sectional side view portion of an inverted semiconductor substrate having a CMOS structure formed in the front side of the substrate and showing a masking layer overlying the backside of the substrate and a via formed in the substrate to diffusion/contacts for an embodiment of an integrated circuit in accordance with the invention.

FIG. 5 shows a schematic illustration of a cross-sectional side view portion of an integrated circuit structure. The integrated circuit structure has been inverted so that what is conventionally considered the frontside of the chip appears at the bottom of the figure. The portion of the integrated circuit illustrated in FIG. 5 shows a semiconductor substrate 300 of, for example, silicon, having embedded in substrate 300 and formed thereon a conventional complimentary metal oxide semiconductor ("CMOS") field effect transistor inverter. The CMOS inverter consists of both an NMOS device and a PMOS device, separated in this illustration by shallow-trench isolation techniques (denoted by dielectric-filled trenches labeled "STI"). It is to be appreciated that other isolation techniques, such as for example, Local Oxidation of Silicon (LOCOS), can be used to isolate the devices of the circuit.

In FIG. 5, the gate 310 of the NMOS device is connected to the gate 315 of the PMOS device. NMOS gate 310 has adjacent source region 320 and drain region 325. Similarly, PMOS gate 315 has adjacent source region 335 and drain region 330. A polysilicon interconnect layer 332 lies adjacent to the PMOS and NMOS devices. A dielectric layer 337, for example, a plasma deposited silicon oxide ($SiO_2$), overlies the structure. Vias are formed to the diffusion regions and gates. A conductive plug material 340, such as for example, tungsten (W), fills the vias. Metal tracks 342, in the first layer of metal interconnect using, for example, aluminum (Al/Cu), are coupled to plug material 340 to connect the adjacent gates 310 and 315, respectively. FIG. 5 also illustrates metal tracks, e.g., Al/Cu tracks, 345 and 347 coupled to plug material 340 to the source of the NMOS and PMOS devices, respectively, to form contacts to these regions. Also, metal tracks 348, e.g., Al/Cu tracks, are coupled to plug material 340 deposited in vias to drains 325 and 330 of the NMOS and PMOS devices, respectively, to connect drains 325 and 330 to one another. A second layer of dielectric 349, for example, a silicon dioxide ($SiO_2$) glass, overlies the first metallization layer containing tracks 342, 345, 347, and 348, respectively. It is to be appreciated, that integrated circuits may have five or more metal interconnect layers. In FIGS. 5–12 only one metal layer, illustrated collectively as 342, 345, 347, and 348, respectively, is shown to facilitate understanding of the invention. The invention is suitable for devices having multiple levels of interconnect on the frontside of substrate 300.

On the backside of substrate 300, via 355 is formed to drain/contacts 325 of the NMOS device. The connection could also be made to the PMOS device or both the NMOS and PMOS devices. Connection to the NMOS device only is shown for clarity. First, a masking layer 350, such as for example, a silicon nitride ($Si_3N_4$) masking layer 350, is deposited over the backside of substrate 300 to protect substrate 300 from a subsequent etchant and to define a via. Next, the backside of substrate 300 is exposed to a suitable etchant to form via 355 in substrate 300 to drain 325. Since the substrate thickness is likely greater than 500 microns ($\mu$m), a fast etch method is used to etch via 355. A suitable etch method is wet anisotropic etching of the silicon along the 111 planes using, for example, potassium hydroxide (KOH). Such an etch method generates a tapered hole. Plasma etching could also be utilized, such as for example, using an $SF_6$ etch chemistry in a reactive ion etcher (RIE) or an electron cyclotron resonance (ECR) etcher.

In FIG. 5, the CMOS circuit shown is a clock driver 375. A clock signal is delivered, for example, to gate 342. The output of clock driver 375, i.e., drain 330 and drain 335 connected to metal 348, is connected to the clock network.

Figure 6:
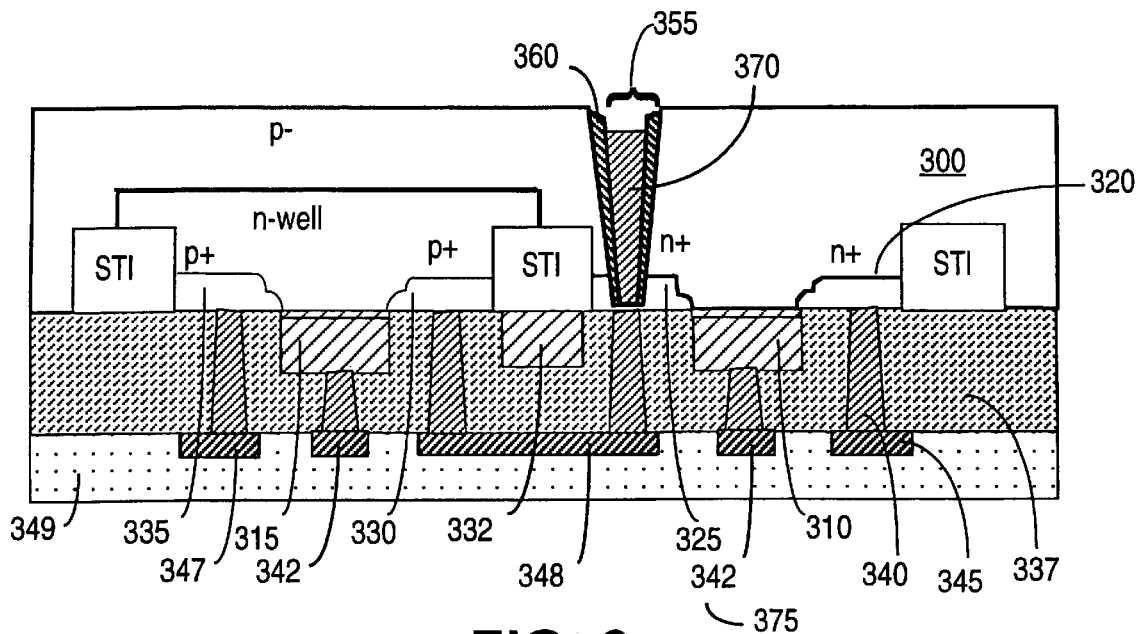
FIG. 6 is a schematic illustration of a cross-sectional side view portion of an inverted semiconductor substrate having a CMOS structure formed in the frontside of the substrate and showing a dielectric material passivating the sidewalls of the via in the backside of the substrate in accordance with the invention.

Once via 355 is formed in the backside of substrate 300 to the inverter that is, for example, clock driver 375 or other clocked circuit, FIG. 6 illustrates the further processing steps to route the clock on the chip backside. FIG. 6 is a schematic illustration of a cross-sectional side view portion of inverted semiconductor substrate 300. In FIG. 6, masking layer 350 has been removed, and a dielectric interface layer 360 is formed along the side wall of via 355 to passivate via 355. Dielectric interface layer 360 may be deposited by conventional techniques, such as for example, chemical vapor deposition of dielectric material, or may be grown, for example, such as, thermal $SiO_2$. Dielectric interface layer 360 seals off any exposed silicon in via 355 and passivates via 355. Dielectric interface layer 360 serves as an interface between substrate 300 and the conducting material that will ultimately fill via 355. At this point, any dielectric material formed in the bottom of the via is removed, for example, by an anisotropic etch, such as a reactive ion etch.

In one embodiment, a dielectric material 360 with a low dielectric constant, on the order of 4.1 or less, is formed along the sidewalls of via 355. The low dielectric constant material reduces the capacitive load required of the clock network so the power requirements of the clock driver can be reduced, since the power (the $CV^2f$ power) dissipated is completely due to the capacitive load that is driven. Dielectric materials with low dielectric constants include, but are not limited to, $SiO_2$, $SiO_2$ xerogel, fluorinated amorphous carbon, fluorinated $SiO_2$, various fluorinated polymers, and hydrogen silisesquioxane (HSQ). A barrier layer, such as titanium nitride, as used in conventional CMOS processing, may be applied to the sidewalls to improve adhesion between a conductive material and the via sidewalls.

FIG. 6 also illustrates the subsequent processing step of depositing a conductive plug material 370, such as for example tungsten (W), into via 355. The substrate backside is then etched, for example, by a plasma etch, to remove excess plug material and interface layer material from the substrate backside.

Figure 7:
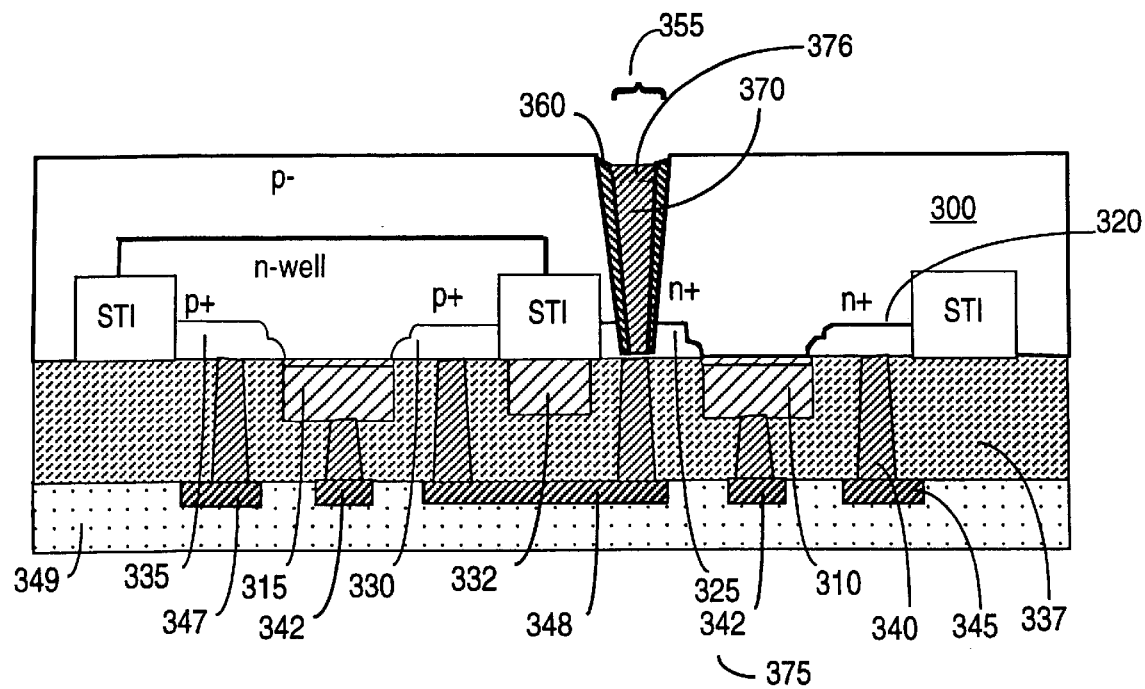
FIG. 7 is a schematic illustration of a cross-sectional sectional side view portion of an inverted semiconductor substrate having a CMOS circuit formed in the frontside of the substrate and showing a conductive material plug deposited in a passivated via formed in the backside of the substrate to diffusion, and a clock network line coupled to the plug in accordance with the invention.
Figure 8:
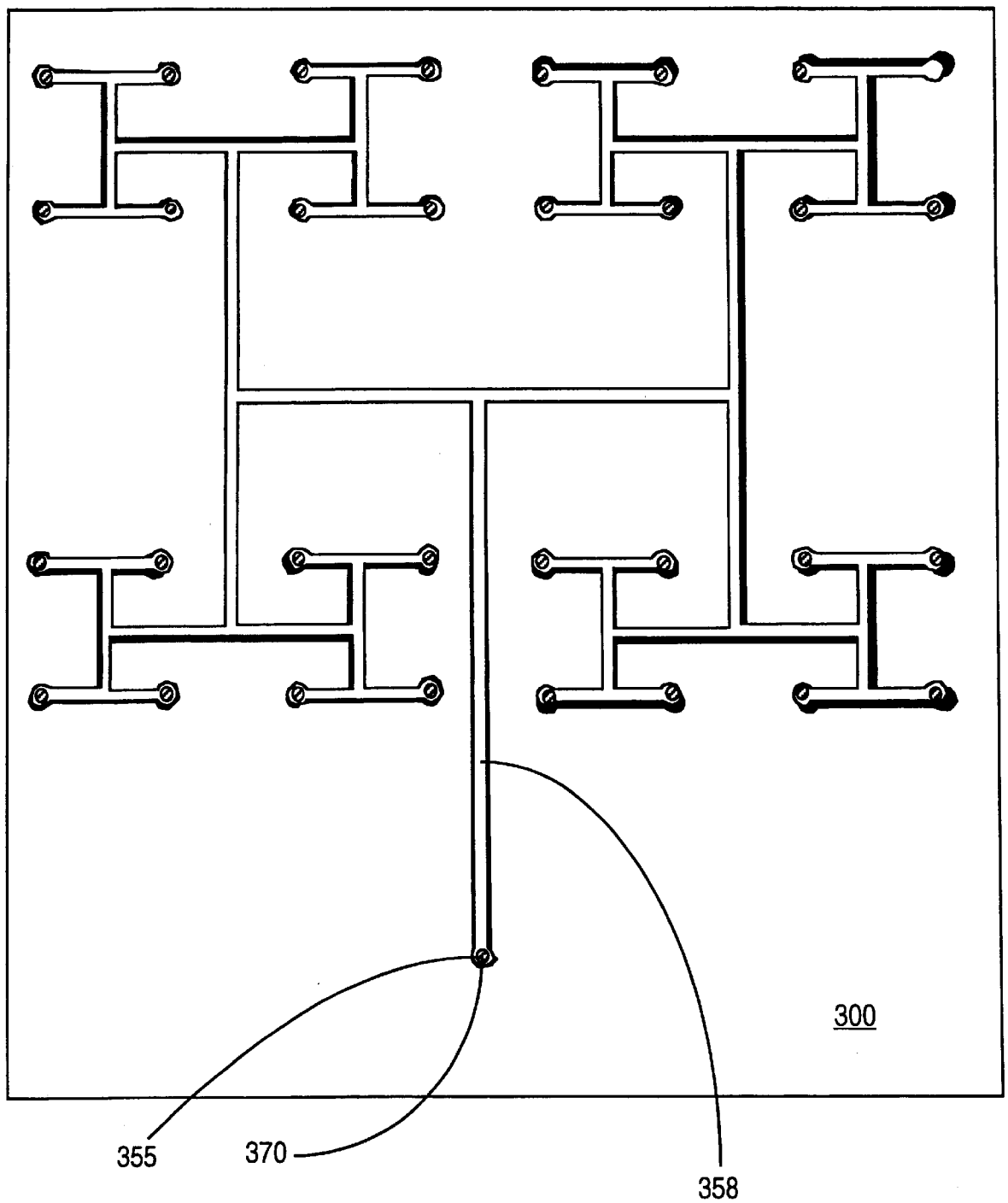
FIG. 8 is a schematic illustration of a portion of an inverted semiconductor structure having a trench outlining a hierarchical H-tree clock network in the substrate backside for recessing a clock network.

Once the through-silicon vias are formed and filled with metal plugs, FIG. 7 illustrates the next step to fabricate the actual H-tree on the backside of the silicon substrate. In one embodiment, the invention contemplates that the clock network be recessed into the backside of substrate 300 so as to be compatible with existing heat sink technology. FIG. 8 shows a schematic top view illustration of a portion of a semiconductor substrate having a trench 358 outlining a portion of hierarchical H-tree clock network formed into the backside of semiconductor substrate 300. In this example, via 355 represents a via to clock driver 375 which is the CMOS inverter illustrated in FIG. 5 (and the circuit diagram illustrated in FIG. 4) filled with conductive plug material 370. Since the via hole is tapered and not drawn to scale, it is to be appreciated that the diameter of the hole on the silicon backside can be much bigger than the width of the interconnect. The recessed network connects the clock driver to the receiving stations about the chip.

The recessed clock network illustrated in FIG. 8 may be formed by conventional trenching techniques. For example, the network may be formed by applying a masking layer, such as for example, silicon nitride ($Si_3N_4$), to the backside of substrate 300 and exposing an area on substrate 300 that will accommodate the clock network. Alternatively, a direct write, silicon micromachining technology such as chlorine-enhanced laser etching or laser ablation could also be used. A short recess, for example, a shallow trench equivalent to the desired thickness of the fill material, is etched into substrate 350. Next, the sidewalls of the clock network trench are passivated and, as illustrated in FIG. 7, a conductive metal line 376, such as for example aluminum (Al/Cu), that is the clock network is deposited over the top of conductive material 370 to make an electrical connection to conductive material 370.

FIG. 7 shows clock network 376 overlying conductive plug material 370 in via 355. Clock network 376 is separated or isolated from substrate 300 by dielectric layer 360. Clock network 376 is also recessed relative to the surface of substrate 300. Recessing of clock network 376 is optional and will allow the subsequent attachment of a heat sink to the backside of substrate 300 with minimal disruption of existing processes.

Figure 9:
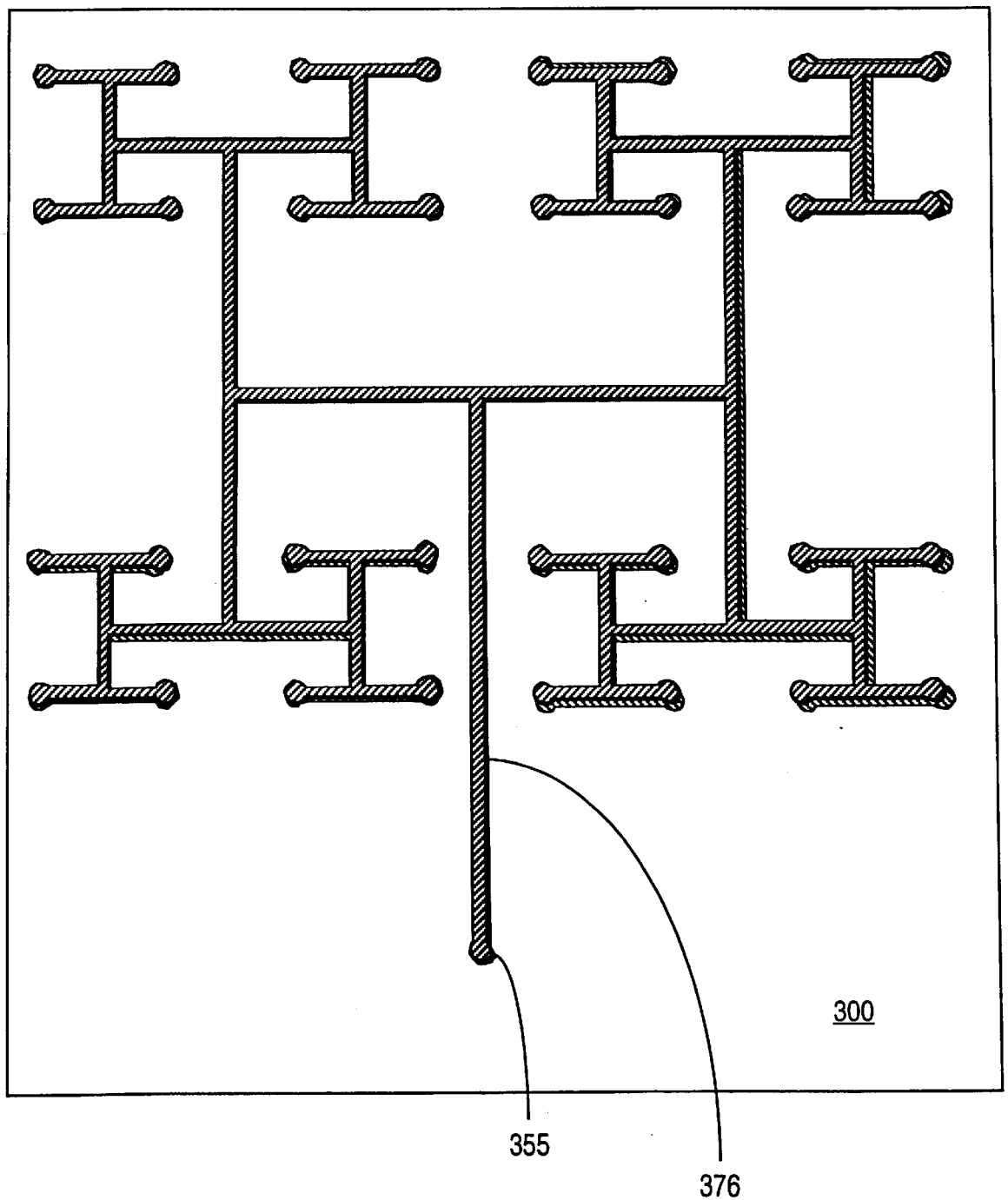
FIG. 9 is a schematic illustration of a portion of an inverted semiconductor substrate in which a trench outlining a hierarchical H-tree clock network has been formed in the substrate the trench being passivated and filled with metal that forms the network in accordance with the invention.

As noted above with respect to FIG. 8 and the accompanying text, a shallow trench can be formed in substrate 300 to define clock network 376, such as for example an H-tree network as illustrated in the schematic top view of FIG. 9, to recess clock network 376 in substrate 300. As noted with respect to FIG. 6 and the accompanying text, the trench is shallower than the vias formed to the individual receiving stations of the network. It is to be appreciated that the depth of the clock network outline trench is primarily a function of the desired thickness of the clock network conductive material 376.

The invention contemplates that the metallization layer 375 that forms the clock network may be thicker than conventional metallization layers. A thicker metallization layer 376 (i.e., a larger aspect ratio), such as for example, on the order of 5.0 microns (as compared to 1.5 microns as in the prior art), reduces the resistance of the metal, because resistance is inversely proportional to metal layer thickness (R=resistivity/layer thickness). Lowering the resistance therefore reduces the "RC delay," which is a common measure of chip circuit speed.

Figure 10:
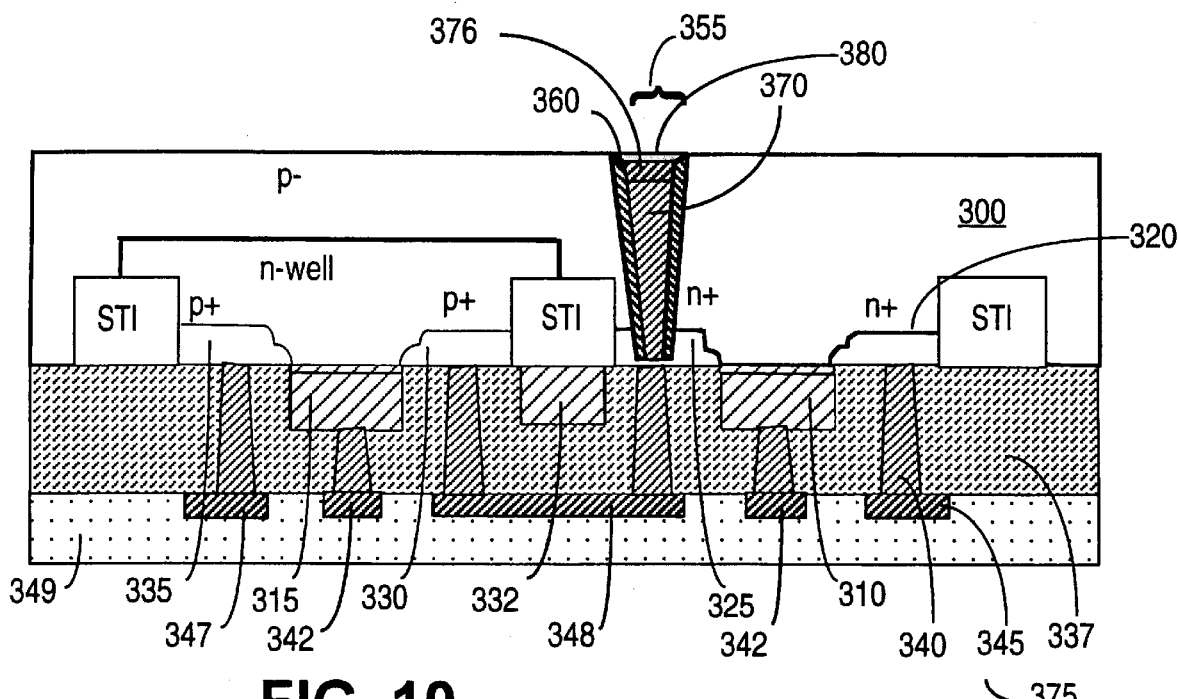
FIG. 10 is a schematic illustration of a cross-sectional side view portion of an inverted semiconductor substrate having a CMOS circuit formed in the frontside of the substrate and showing a second dielectric layer overlying the clock network in accordance with the invention.

FIG. 10 is a schematic illustration of a cross-sectional side view portion of the inverted semiconductor substrate. In FIG. 10, dielectric layer 380 is formed over clock network 376. Dielectric layer 380 may be deposited by conventional techniques, such as for example, chemical vapor deposition of dielectric material. Dielectric layer 380 serves to passivate and protect the otherwise exposed portion of clock network 376 (such as for example an H-tree network) thus isolating clock network 376 from the heat sink that will subsequently be applied to substrate 300, grease, air, etc. Suitable dielectric material for dielectric layer 380 includes $SiO_2$. Dielectric layer 380 may also be the same material as interface layer 360.

Figure 11:
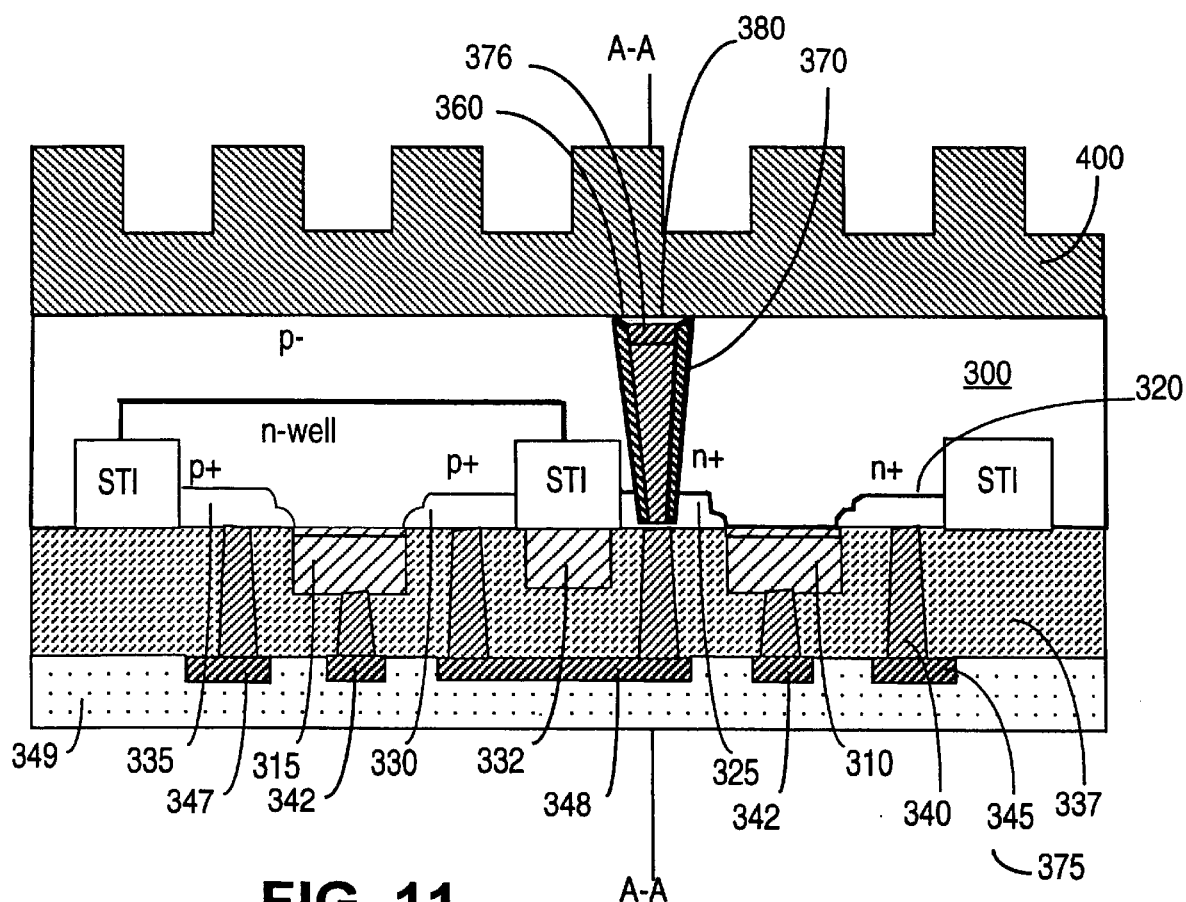
FIG. 11 is a schematic illustration of a cross-sectional side view portion of an inverted semiconductor substrate having a CMOS circuit on the frontside of the substrate and showing a heat sink coupled to the backside of the substrate in accordance with the invention.

FIG. 11 is a schematic illustration of a cross-sectional side view portion of the inverted semiconductor substrate. In FIG. 11, heat sink 400 is attached to substrate 300. Because the clock network, represented by conductive layer 376, is recessed, heat sink 400 conforms to the backside of substrate 300 as in prior structures. Thus, routing clock network 376 on the backside of substrate 300 provides minimal disruption to conventional attachment of the heat sink to the substrate backside in C4 packaging technology.

Figure 12:
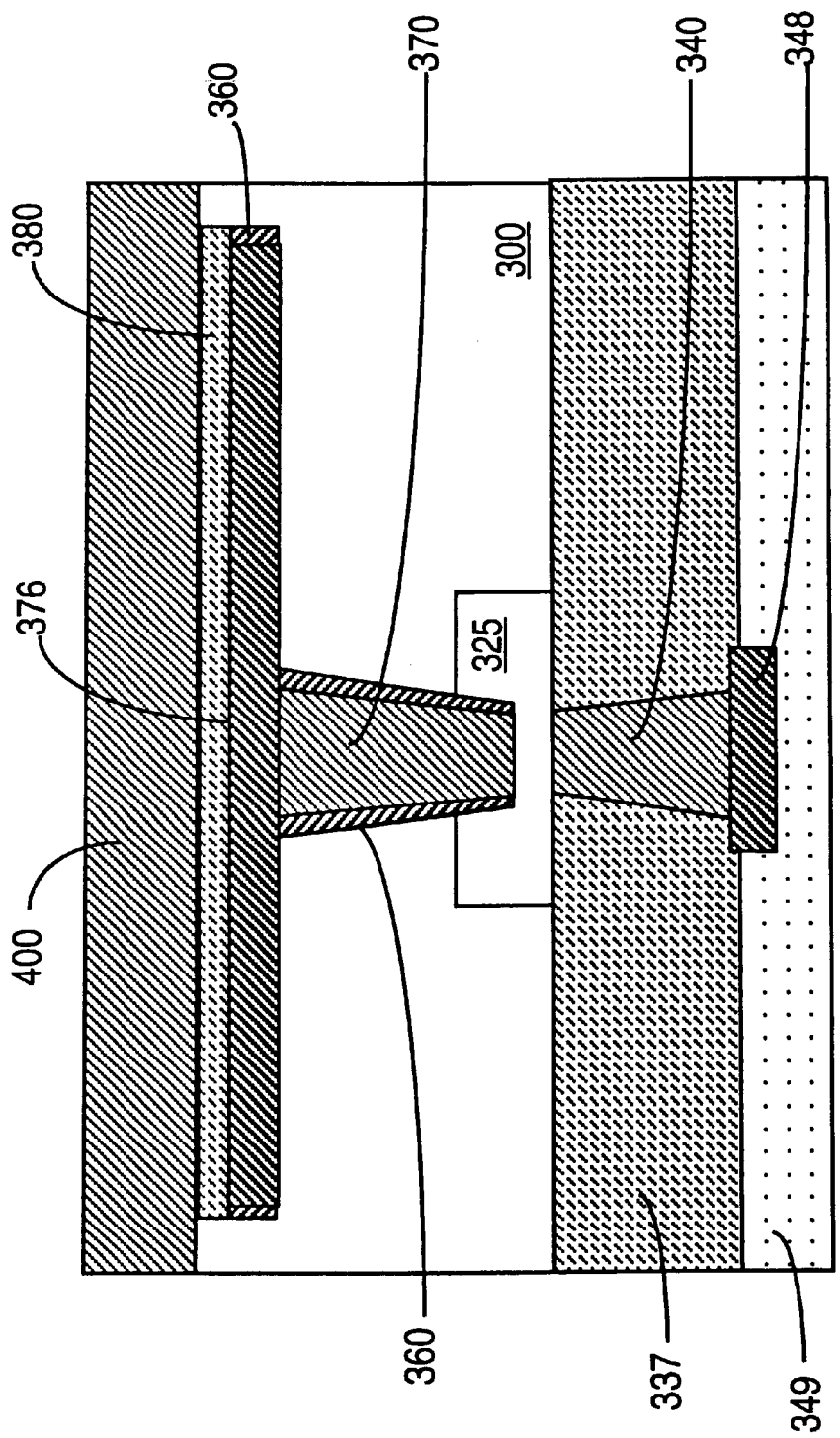
FIG. 12 is a schematic illustration of a cross-sectional side view of a portion of an inverted substrate taken through line A—A of FIG. 11 in accordance with the invention.

FIG. 12 is a schematic illustration of a cross-sectional side view portion of inverted semiconductor substrate 300 taken through line A—A of FIG. 11. FIG. 12 shows conductive plug material 370 connected to diffusion contact region 325. Conductive plug material 370 is electrically isolated from substrate 300 by dielectric interface layer 360. Clock network 375 overlies conductive plug material 370 and is likewise electrically isolated from substrate 300. Finally, dielectric layer 380, which can be the same material as interface layer 360, overlies clock network 376 to protect clock network 376 from heat sink 400, grease, air, etc.

Figure 13:
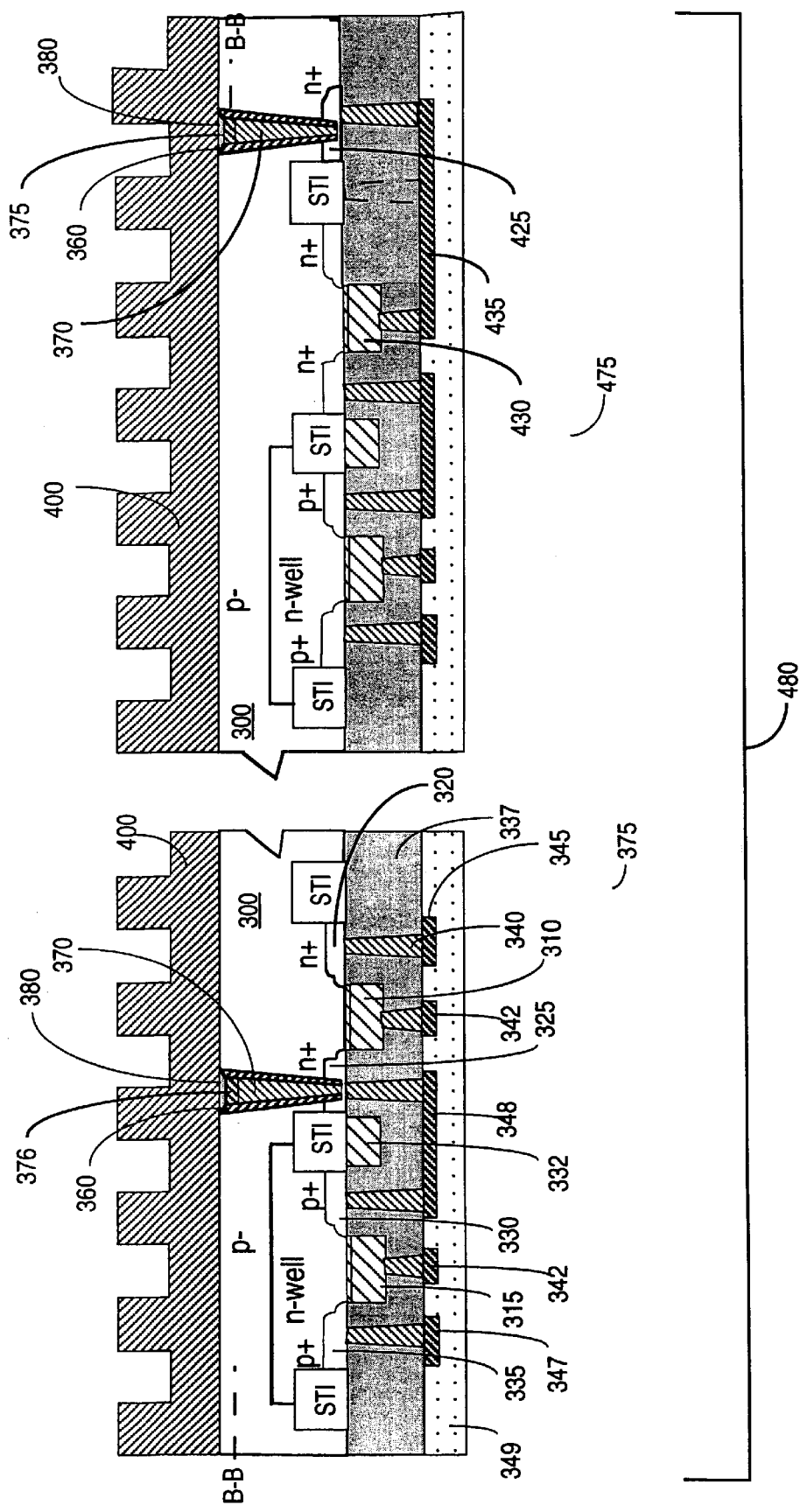
FIG. 13 is a schematic illustration of a side view portion of a clock distribution network routed on the backside of a semiconductor substrate from a clock driver to a receiving station in accordance with the invention.

FIG. 13 is a schematic illustration of a cross-sectional side view portion of inverted semiconductor substrate 300. In FIG. 13, additional circuitry is shown disposed in substrate 300. Inverter circuit 375 is the clock driver which is coupled to a master clock. Also displayed is a second inverter or receiving circuit 475 adjacent to a diffusion region or receiving station 425 for a clock signal from clock driver 375. Receiving station 325 is electrically coupled to gate 430 of receiving circuit 415 by metallization layer 435, such as for example by aluminum (Al) coupled to tungsten (W) filled vias to diffusion/contact region 425 and gate 430, respectively. Receiving station 425 receives a signal from clock driver 375 on clock network 376 and transmits that signal to transistor gate 430. Thus, FIG. 13 shows a portion (collectively labeled 480) of the clock network 376 wherein a receiving circuit 475 is coupled to clock driver 375.

Figure 14:
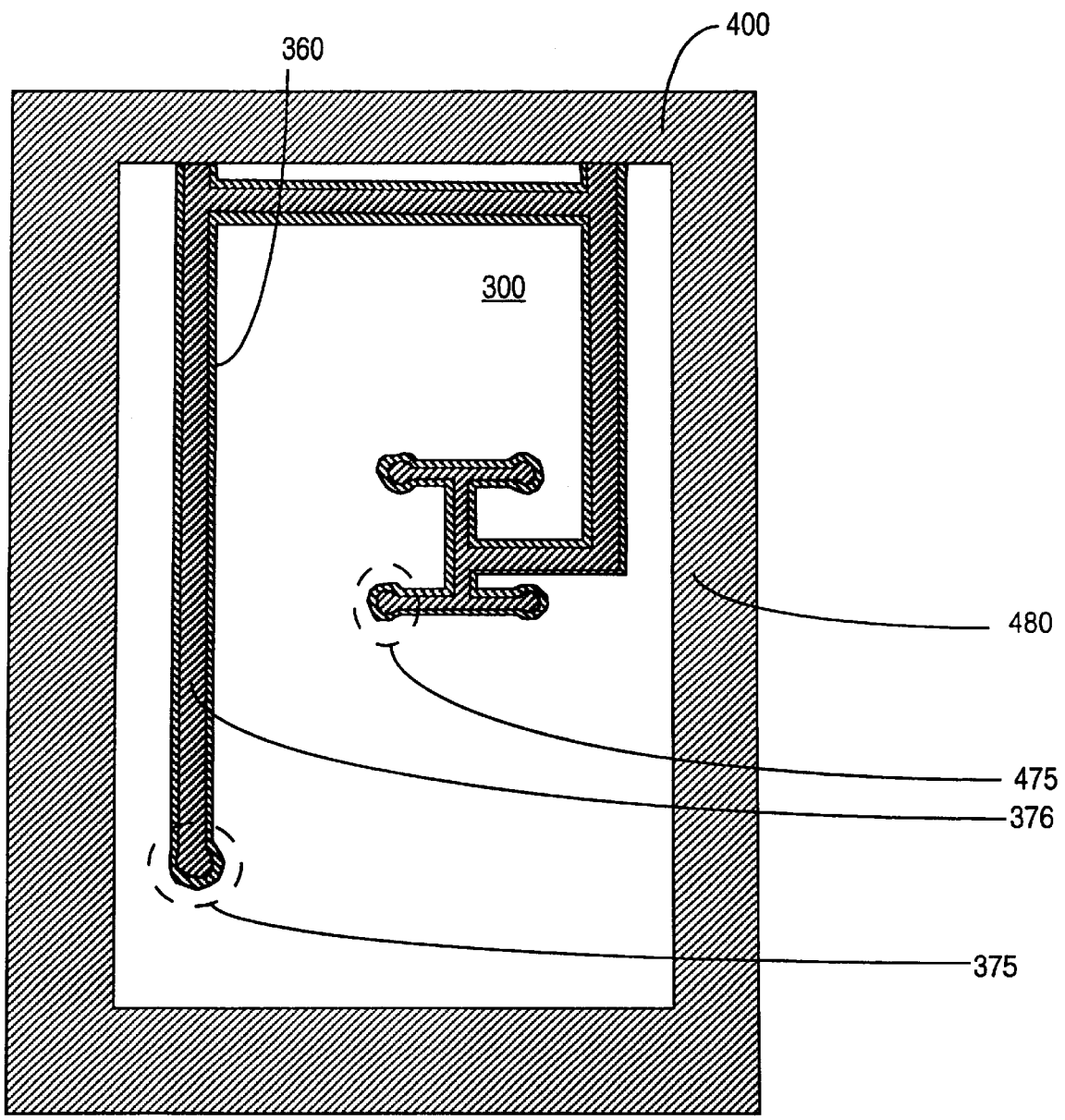
FIG. 14 is a schematic cross-sectional top view taken through line B—B of FIG. 13 and displaying a window through the heat sink and the network passivation layer.

FIG. 14 is a schematic cross-sectional top view taken through line B—B of FIG. 13. FIG. 14 shows heat sink 400 overlying substrate 300, with a portion 480 displaying a window through heat sink 400 and dielectric layer 380. Portion 480 shows clock network 376 coupled to clock driver 375 and receiving circuit 475.

The above discussion focused on a clock network that constituted a single-ended connection between the transmitter and the receiver. The signal return path in this case is complex and through the ground return path of the chip. The clock driver and receiver could also be connected together with a differential connection in which the signal return path is precisely defined.

Figure 15:
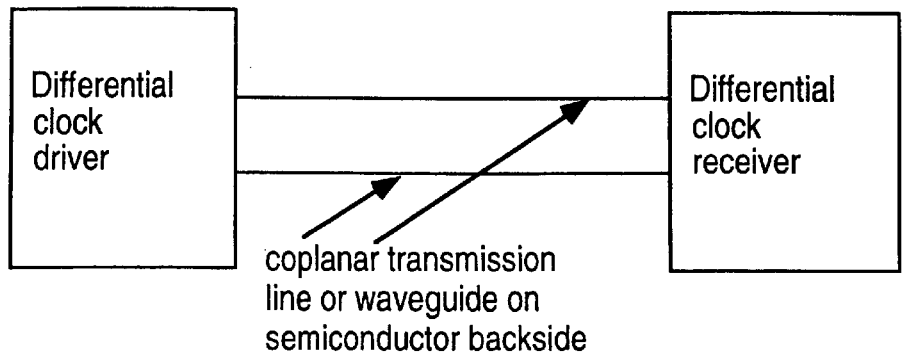
FIG. 15 is a block diagram illustrating the distribution of a differential clock network on the backside of a semiconductor substrate.
Figure 16:
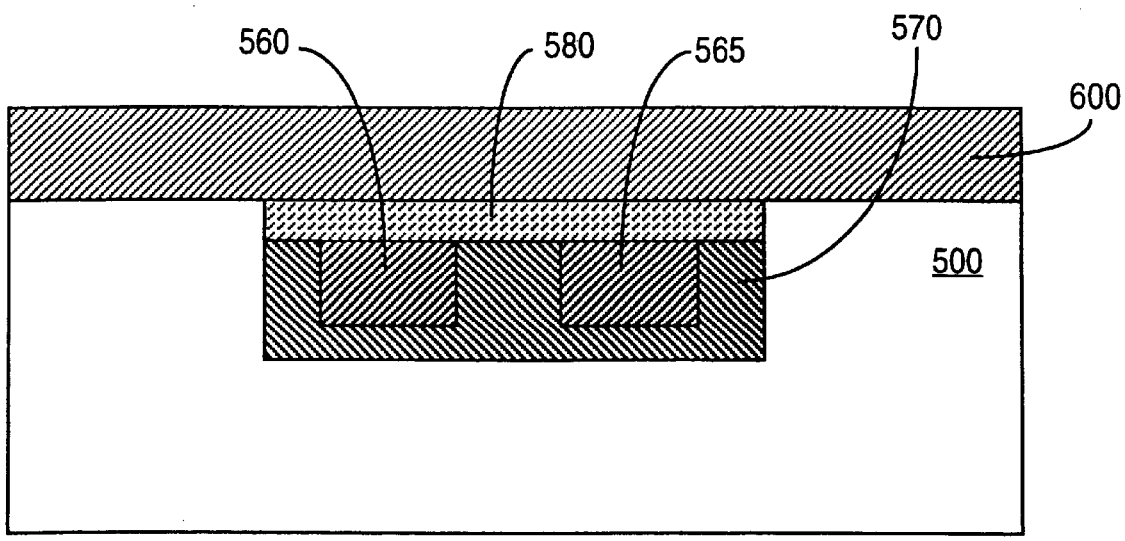
FIG. 16 is a schematic illustration of a cross-sectional side view portion of an inverted semiconductor substrate showing a coplanar waveguide transmission line or waveguide to implement a differential clock network routed on the backside of the substrate.

FIG. 15 schematically illustrates by way of a block diagram a differential clock network technique that can also be employed on the backside of a semiconductor device. FIG. 15 shows two single connections between driver and receiver of a differential clock routed on the backside of a semiconductor substrate. FIG. 16 is a schematic illustration of a cross-sectional side view portion of an inverted semiconductor (e.g., silicon) substrate 500. Conductive metal (e.g., aluminum) lines 560 and 565 make up the signal paths for a differential clock routing on the backside of substrate 500. For example, conductive metal line 560 carries the clocking signal from the clock driver while conductive metal line 565 carries the inverse of the clocking signal. Each line of the differential connection is configured similarly to the way a single-ended connection is configured. This arrangement is sometimes also referred to as a coplanar transmission line or waveguide. The chief structural difference between the two configurations, is that for a differential connection, two single connections are required between driver and receiver. Conductive metal lines 560 and 565 are isolated from one another and from substrate 500 by a dielectric material 570. In one embodiment, dielectric material 570 has a dielectric constant on the order of 4.1 or less. Conductive material lines 560 and 565 are recessed in a clock network trench such that an overlay of dielectric material 580 is deposited to passivate the lines and protect the lines from heat sink 600, grease, air, etc. FIG. 14 shows a coplanar waveguide formed on the substrate backside.

The differential clock routing utilizes a coplanar waveguide which offers better clocking properties than a single-ended connection since the return path may be controlled more precisely.

The advantages of routing the clock network on the substrate backside are many. First, clock skew due to inner layer thickness variations and electrical activity on lower level metal is eliminated. Second, since there is a near perfect ground plane (the silicon substrate) with no topography over it, the impedance control is excellent. Third, the deskew circuits are eliminated, since propagation delay is uniform. This saves real estate and complexity and eliminates residual jitter. Fourth, since the clock distribution is moved to the silicon backside, more routing space is available for signals, leading to a potentially smaller die size. Fifth, since there are no other non-clock signals nearby or any other metal routing layers above the clock network, the metal thickness of the network can be increased to a larger aspect ratio to reduce resistance and increase circuit speed.

It is to be appreciated that in addition to minimizing clock skew, backside signal routing as previously described can be used to route other types of signals in a similar manner, particularly critical timing signals, inside an integrated circuit chip.

In the preceding detailed description the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus, comprising:
    an integrated circuit having a driver disposed in a first side of a semiconductor substrate; and
    a signal distribution network comprising a plurality of nodes coupled to the driver and disposed in or on a second side of the semiconductor substrate.
2. The apparatus of claim 1, wherein the integrated circuit includes a plurality of circuit elements, the network further comprising:
    a plurality of signal receivers coupled to the plurality of circuit elements,
    wherein the signal distribution network is coupled to the plurality of signal receivers.
3. The apparatus of claim 1, wherein the signal distribution network is an H-tree network.
4. The apparatus of claim 1, wherein the signal distribution network is recessed in the second side of the semiconductor substrate.
5. The apparatus of claim 3, wherein the circuit elements are transistors.
6. An apparatus comprising:
    a driver associated with a first side of a substrate; and
    a signal distribution network coupled to the driver and formed on a second side of the substrate,
    wherein the signal distribution network comprises a plurality of nodes separated from one another and each an equal distance from a point on the substrate.
7. The apparatus of claim 6, wherein the plurality of nodes are first nodes and further comprising:
    a plurality of second nodes associated with each first node, each of the plurality of second nodes separated from one another and each an equal distance from the first node.

* * * * *

UNITED STATES PATENT AND TRADEMARK OFFICE
CERTIFICATE OF CORRECTION

PATENT NO. : 6,316,981 B1
DATED : November 13, 2001
INVENTOR(S) : Rao et al.

It is certified that error appears in the above-identified patent and that said Letters Patent is hereby corrected as shown below:

Column 3,
Line 26, after "are", insert -- used --.

Signed and Sealed this

First Day of October, 2002

Attest:

JAMES E. ROGAN
Attesting Officer   Director of the United States Patent and Trademark Office